US009551929B2

(12) United States Patent
Hatakeyama

(10) Patent No.: US 9,551,929 B2
(45) Date of Patent: Jan. 24, 2017

(54) POSITIVE RESIST COMPOSITION AND PATTERNING PROCESS

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/927,690

(22) Filed: Oct. 30, 2015

(65) Prior Publication Data

US 2016/0147149 A1 May 26, 2016

(30) Foreign Application Priority Data

Nov. 25, 2014 (JP) ................................ 2014-237496

(51) Int. Cl.

| | |
|---|---|
| ***G03F 7/039*** | (2006.01) |
| ***G03F 7/004*** | (2006.01) |
| ***G03F 7/20*** | (2006.01) |
| ***G03F 7/11*** | (2006.01) |

(52) U.S. Cl.

CPC .......... *G03F 7/0045* (2013.01); *G03F 7/0046* (2013.01); *G03F 7/0392* (2013.01); *G03F 7/11* (2013.01); *G03F 7/2041* (2013.01)

(58) Field of Classification Search

None

See application file for complete search history.

(56) References Cited

U.S. PATENT DOCUMENTS

| | | | | |
|---|---|---|---|---|
| 5,786,131 | A | 7/1998 | Allen et al. | |
| 5,879,857 | A * | 3/1999 | Chandross ............ | G03F 7/0045 430/270.1 |
| 6,497,987 | B1 * | 12/2002 | Kim .......................... | C07J 1/00 430/270.1 |
| 6,770,414 | B2 * | 8/2004 | Jung .......................... | C07J 9/00 430/270.1 |
| 7,615,329 | B2 * | 11/2009 | Meagley ............... | G03F 7/0045 430/270.1 |

FOREIGN PATENT DOCUMENTS

| | | | |
|---|---|---|---|
| JP | 8-15865 | A | 1/1996 |
| JP | 2001-235861 | * | 8/2001 |
| JP | 2001-255655 | * | 9/2001 |
| JP | 2012-159583 | * | 8/2012 |

* cited by examiner

*Primary Examiner* — Martin Angebranndt

(74) *Attorney, Agent, or Firm* — Westerman, Hattori, Daniels & Adrian, LLP

(57) ABSTRACT

An androstane or estrane-substituted cholane as base resin is combined with an acid generator to formulate a positive resist composition, especially chemically amplified positive resist composition.

4 Claims, No Drawings

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2014-237496 filed in Japan on Nov. 25, 2014, the entire contents of which are hereby incorporated by reference.

TECHNICAL FIELD

This invention relates to a positive resist composition, especially chemically amplified positive resist composition comprising a specific compound as base resin, and a pattern forming process using the resist composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With the advance of miniaturization, it is confirmed that line width roughness (LWR) has an impact on the performance of transistors. A reduction of LWR is thus demanded. Effective approaches for reducing LWR include an increase in the amount of PAG added, addition of an acid generator capable of generating an acid which does not cause deprotection of a protective group, and binding of PAG to a polymer backbone. Highly transparent PAGs which do not detract from transparency even when added in larger amounts, acid generators capable of generating weak acids, and PAG-bound polymers have been developed.

Efforts to develop molecular resist materials were made under the hypothesis that a monomer is more effective for reducing LWR due to the smallness of its molecular size than a polymer. Such molecular resist materials include acid labile group-substituted phenolic low nuclear compounds, calix-resorcin, NORIA, truxene, cyclodextrin and other phenol derivatives. JP-A H08-15865 discloses a molecular resist material comprising acid labile group-substituted cholate. As compared with polymeric resist materials, molecular resist materials allow for extensive and non-uniform acid diffusion. For this reason, molecular resist materials fail to achieve a LWR level surpassing polymeric resist materials. It would be desirable to have a molecular resist material which is effective for suppressing acid diffusion to achieve a lower LWR than polymeric resist materials.

CITATION LIST

Patent Document 1: JP-A H08-15865 (U.S. Pat. No. 5,786, 131)

DISCLOSURE OF INVENTION

An object of the invention is to provide a positive resist composition which exhibits a higher resolution and lower LWR than prior art positive resist compositions, and forms a resist film capable of forming a pattern of satisfactory profile after exposure and having etch resistance; and a pattern forming process using the resist composition.

Seeking for a positive resist composition which exhibits a high resolution and minimal roughness (LWR and LER) as currently desired, a pattern of satisfactory profile subject to etching, and etch resistance, the inventor has found that an androstane or estrane-substituted cholane is useful as a base resin in a positive tone molecular resist composition, especially chemically amplified positive tone resist composition.

Considering the fact that molecular resist compositions suffer from increased LWR because more acid diffusion is allowed than in polymeric resist compositions, the inventor has reached a molecular resist composition capable of minimizing acid diffusion. Specifically, it is a positive molecular resist composition, especially chemically amplified positive resist composition, comprising an androstane or estrane-substituted cholane. Because of a significantly high contrast of alkaline dissolution rate before and after exposure, a remarkable acid diffusion suppressing effect, a high resolution, a pattern of satisfactory profile and roughness after exposure, and high etch resistance, the positive molecular resist composition, especially chemically amplified positive resist composition is best suited as a micropatterning material for the fabrication of VLSIs and photomasks.

The positive resist composition of the invention has advantages including a high dissolution contrast of resist film, a remarkable acid diffusion suppressing effect, a high resolution, an exposure latitude, process adaptability, a pattern of satisfactory profile after exposure, and high etch resistance. Because of these advantages, the composition is readily implemented in practice and best suited as a VLSI-forming resist material and mask pattern forming material.

In one aspect, the invention provides a positive resist composition comprising a resin the general formula (1)-1 and/or (1)-2 and an acid generator.

(1)-1

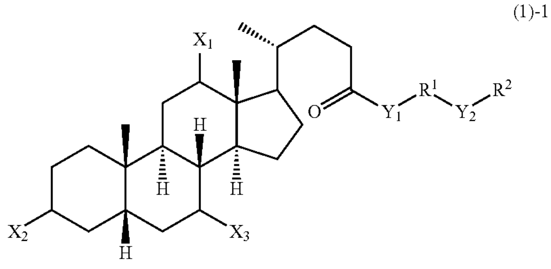

-continued (1)-2

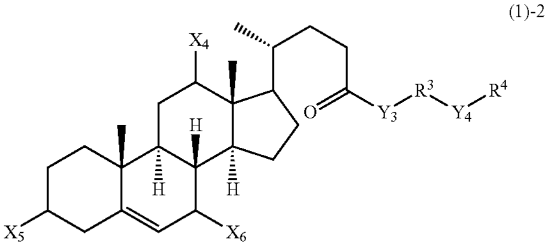

Herein $R^1$ and $R^3$ each are a single bond or a straight, branched or cyclic $C_1$-$C_{20}$ alkylene group which may have an ether or ester moiety, $Y_1$ and $Y_3$ each are oxygen or —NH—, $Y_2$ and $Y_4$ are single bonds when $R^1$ and $R^3$ are single bonds, and otherwise —C(=O)—O—, $X_1$ to $X_6$ are each independently hydrogen, hydroxy, alkoxy, acyloxy or carbonyl, $R^2$ and $R^4$ each are an acid labile group selected from the following formulae (1)-3 to (1)-7:

(1)-3

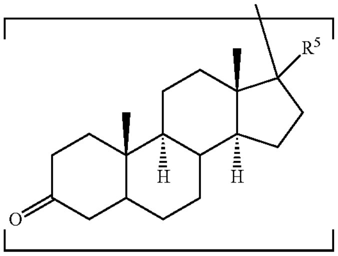

(1)-4

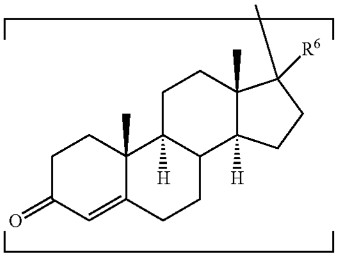

(1)-5

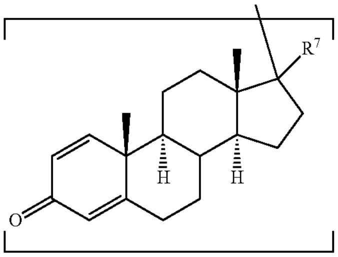

(1)-6

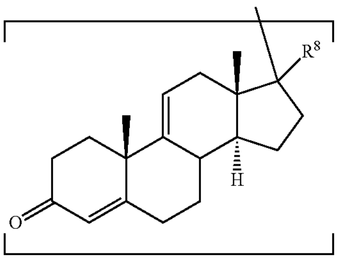

-continued (1)-7

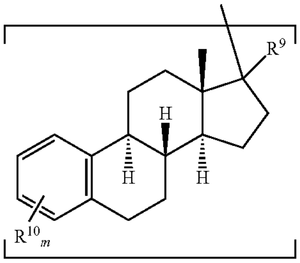

wherein $R^5$ to $R^9$ are each independently a straight, branched or cyclic $C_1$-$C_4$ alkyl, $C_2$-$C_4$ alkenyl, or $C_2$-$C_4$ alkynyl group, $R^{10}$ is hydroxy, alkoxy or acyloxy, m is 1 or 2, the line segment protruding out of the bracket denotes a valence bond.

The positive resist composition may further comprise an organic solvent, a basic compound, and a surfactant.

In another aspect, the invention provides a pattern forming process comprising the steps of coating a substrate with the positive resist composition defined above, baking the composition to form a resist film, exposing the resist film to high-energy radiation, and developing the exposed resist film in a developer.

The positive resist compositions, especially chemically amplified positive resist compositions are used not only in the lithography for semiconductor circuit formation, but also in the formation of mask circuit patterns, micro-machines, and thin-film magnetic head circuits.

Advantageous Effects of Invention

The positive resist composition of the invention exhibits a significantly high contrast of alkaline dissolution rate before and after exposure, a high resolution, a pattern of satisfactory profile and minimal roughness after exposure, a significantly controlled acid diffusion rate, and high etch resistance. Because of these advantages, the positive resist composition, especially chemically amplified positive resist composition is best suited as a micropatterning material for the fabrication of VLSIs and photomasks, and a pattern-forming material subject to KrF, ArF, EB and EUV lithography processes.

DESCRIPTION OF EMBODIMENTS

In the disclosure, the notation (Cn-Cm) means a group containing from n to m carbon atoms per group. The abbreviations and acronyms have the following meaning.

EB: electron beam
EUV: extreme ultraviolet
PAG: photoacid generator
Mw: weight average molecular weight
Mn: number average molecular weight
Mw/Mn: molecular weight distribution or dispersity
GPC: gel permeation chromatography
PEB: post-exposure bake
LWR: line width roughness
LER: line edge roughness One embodiment of the invention is a resist composition comprising a resin in the form of a cholic acid whose carboxyl group is substituted with a tertiary ester of androstane, represented by the general formula (1)-1 and/or (1)-2 as base resin.

(1)-1

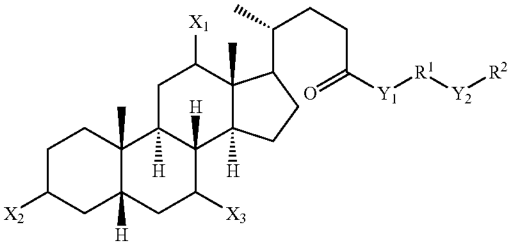

(1)-2

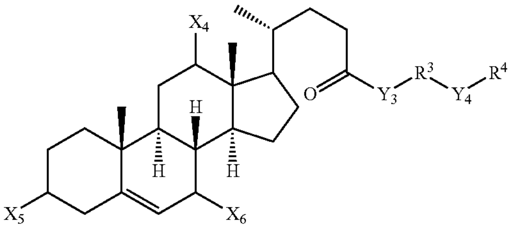

Herein $R^1$ and $R^3$ each are a single bond or a straight, branched or cyclic $C_1$-$C_{20}$ alkylene group which may have an ether or ester moiety. $Y_1$ and $Y_3$ each are oxygen or —NH—, $Y_2$ and $Y_4$ are single bonds when $R^1$ and $R^3$ are single bonds, and —C(═O)—O— when $R^1$ and $R^3$ are otherwise. $X_1$ to $X_6$ are each independently hydrogen, hydroxy, $C_1$-$C_4$ alkoxy, $C_1$-$C_4$ acyloxy or carbonyl. $R^2$ and $R^4$ each are an acid labile group selected from the following formulae (1)-3 to (1)-7:

(1)-3

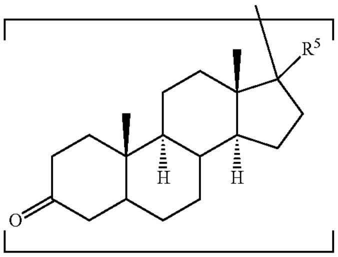

(1)-4

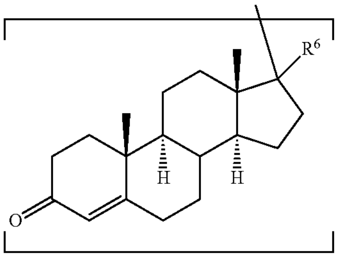

(1)-5

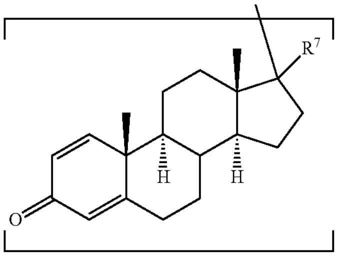

-continued (1)-6

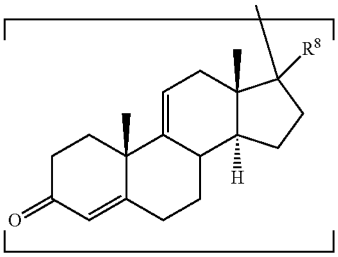

(1)-7

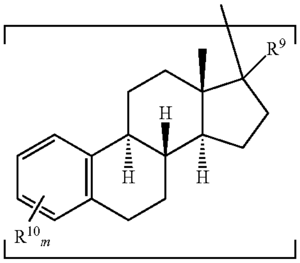

Herein $R^5$ to $R^9$ are each independently a straight, branched or cyclic $C_1$-$C_4$ alkyl, $C_2$-$C_4$ alkenyl, or $C_2$-$C_4$ alkynyl group, $R^{15}$ is hydroxy, $C_1$-$C_4$ alkoxy or $C_1$-$C_4$ acyloxy, and m is 1 or 2. It is noted that the line segment protruding out of the bracket denotes a valence bond.

Illustrative, non-limiting examples of the resins represented by formulae (1)-1 and (1)-2 are shown below.

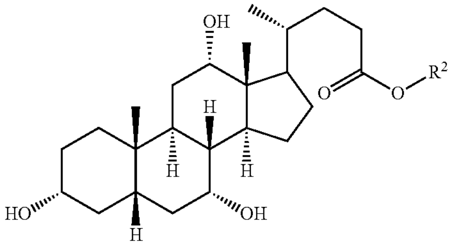

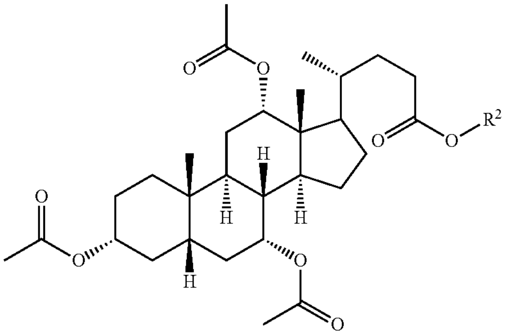

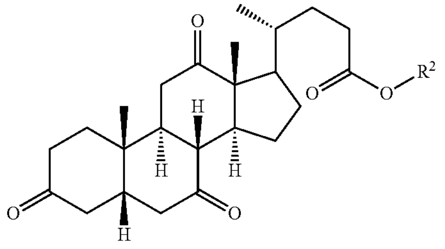

-continued
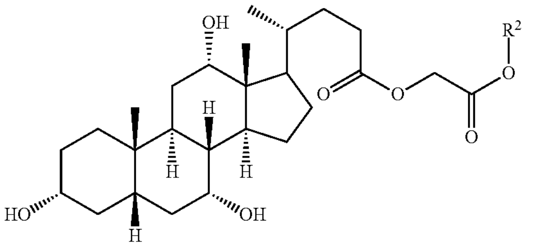
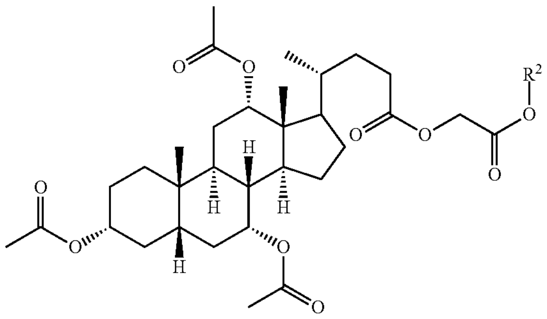
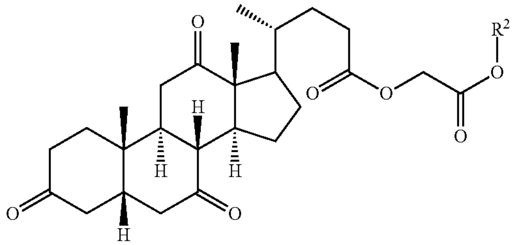
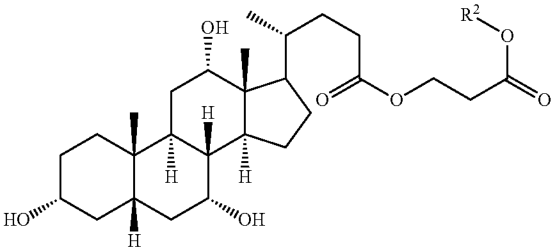
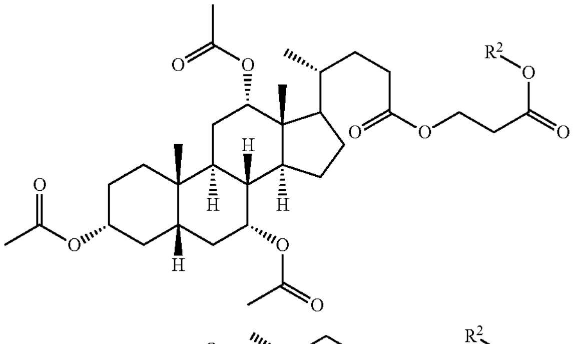
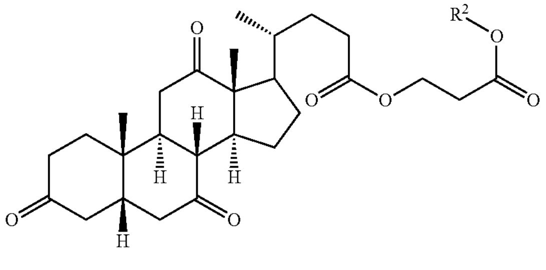
-continued
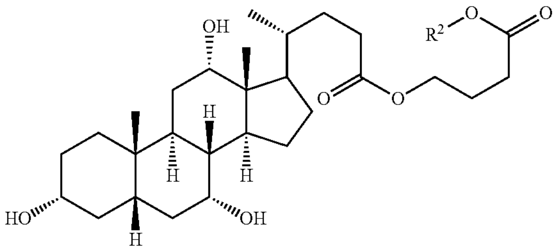
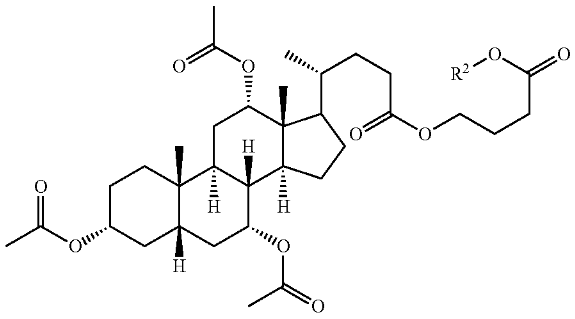
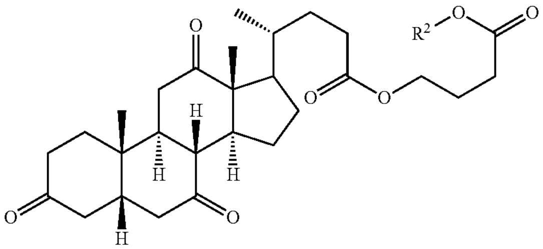
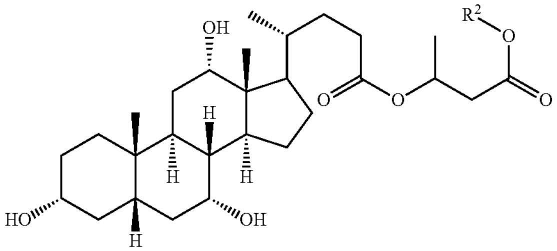
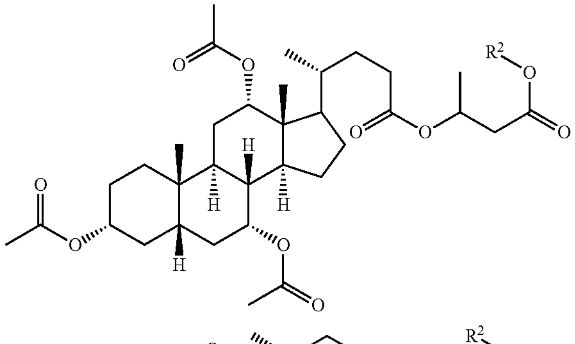
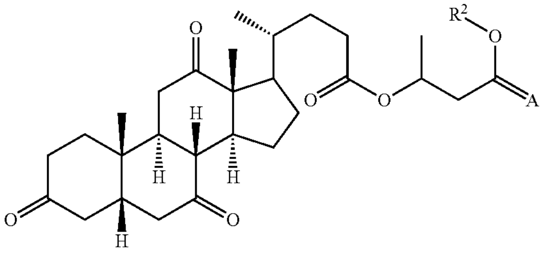

-continued
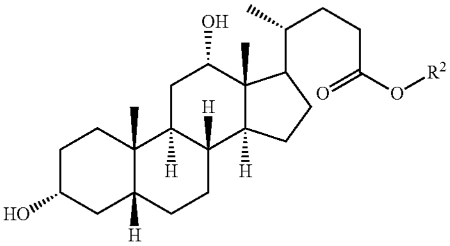
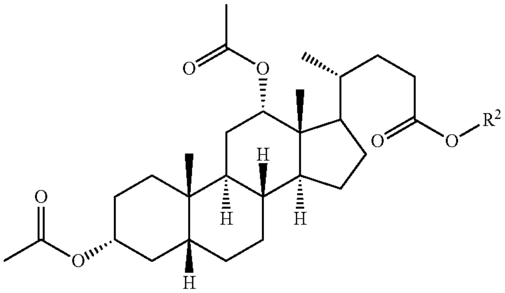
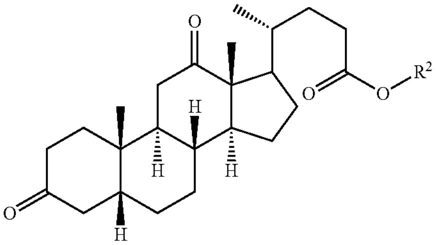
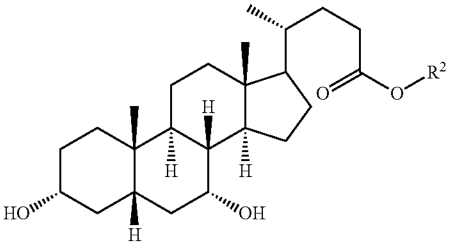
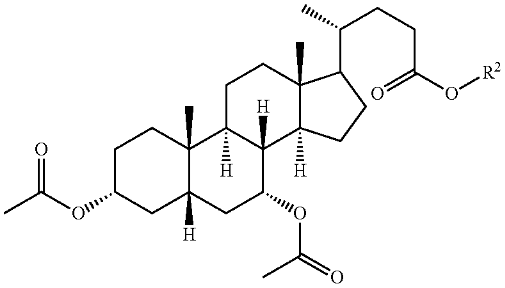
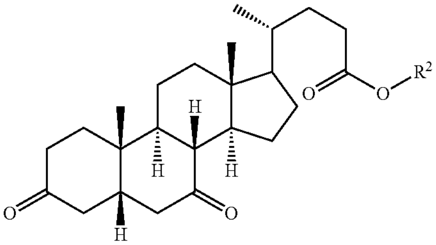
-continued
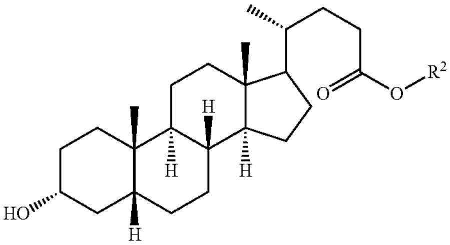
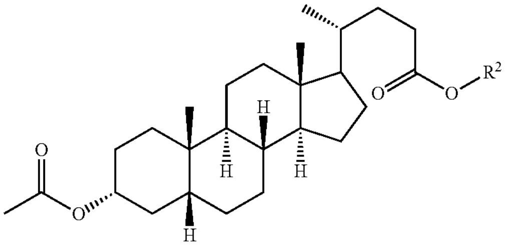
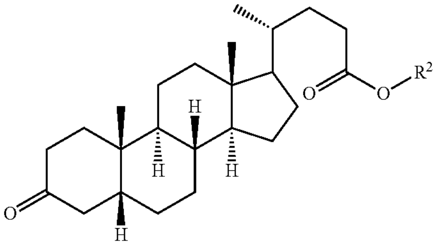
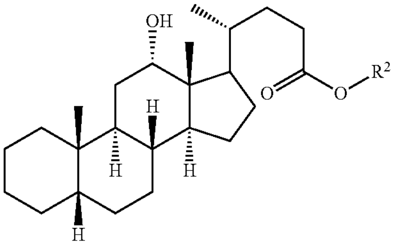
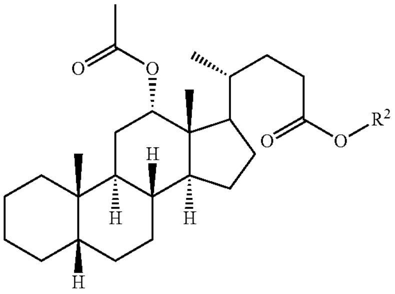
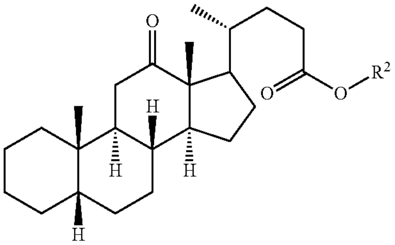

-continued
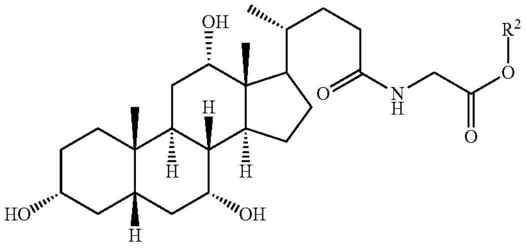
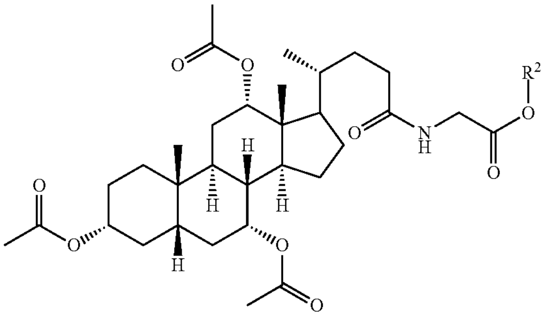
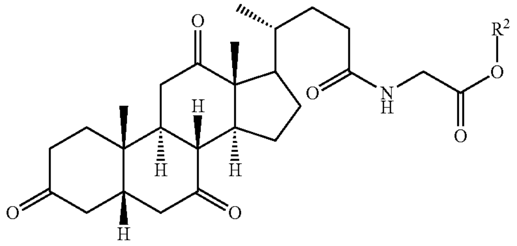
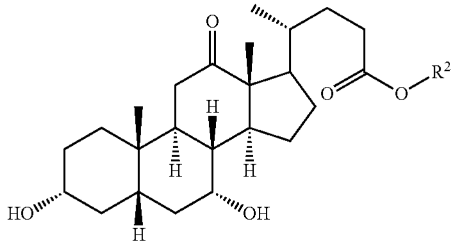
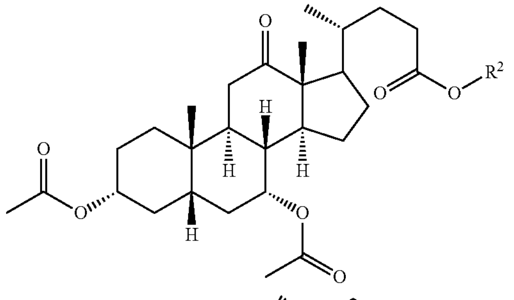
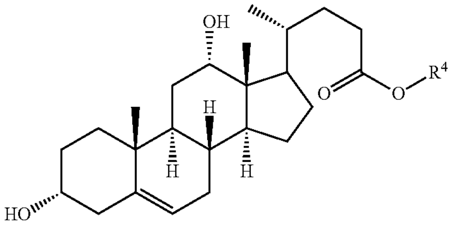
-continued
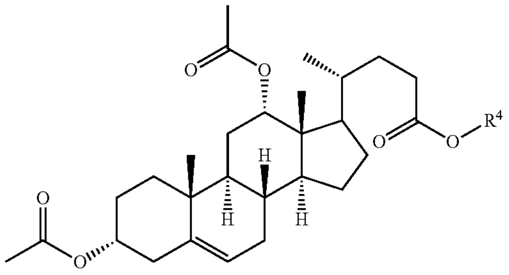
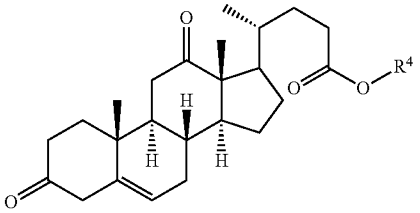
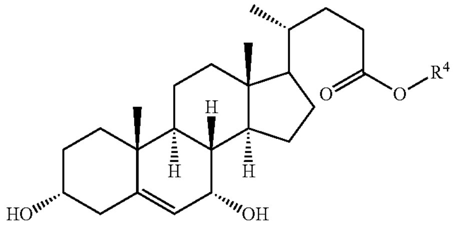
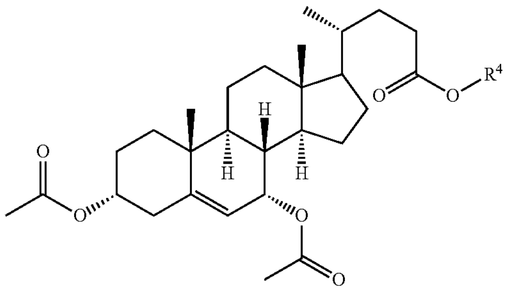
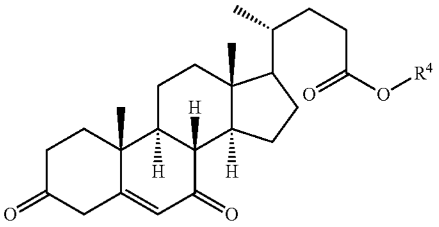
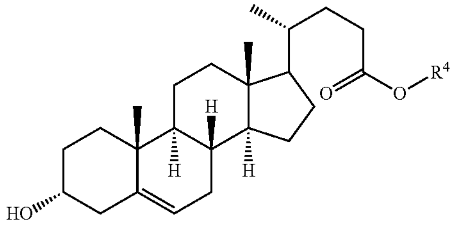
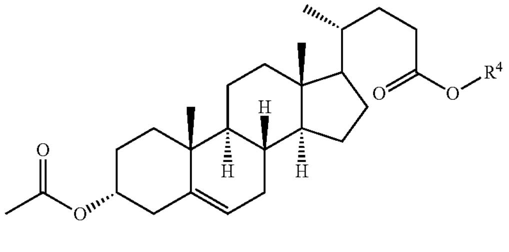

-continued
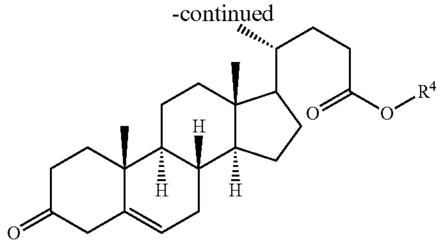
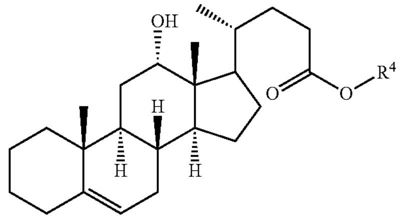
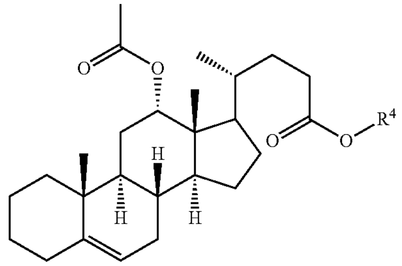
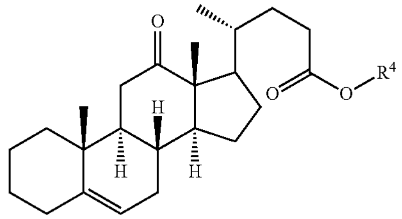
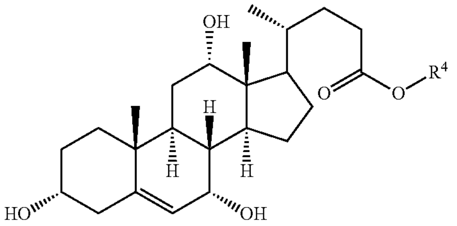
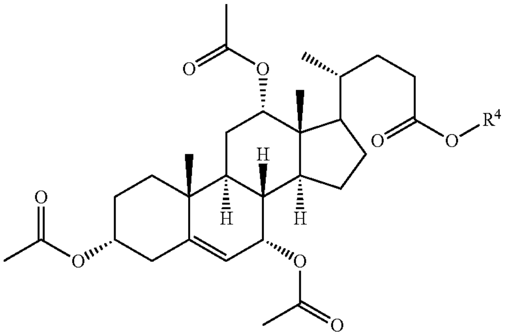
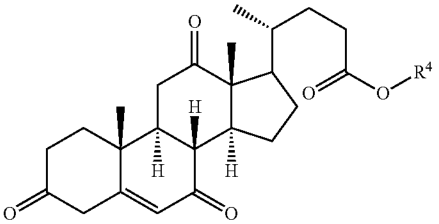
Illustrative, non-limiting examples of the acid labile groups $R^2$ and $R^4$, represented by formulae (1)-3 to (1)-7, are shown below.
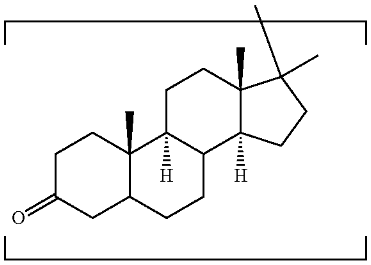
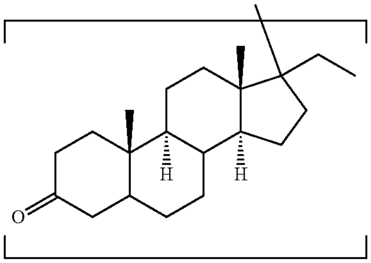
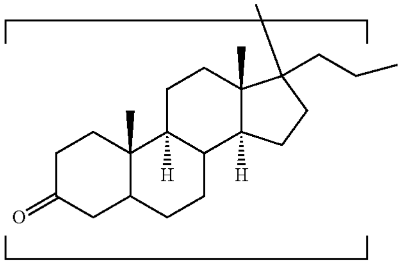
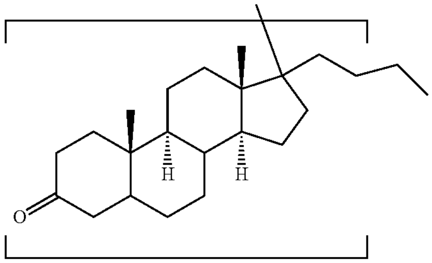
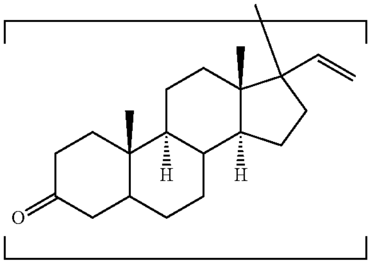
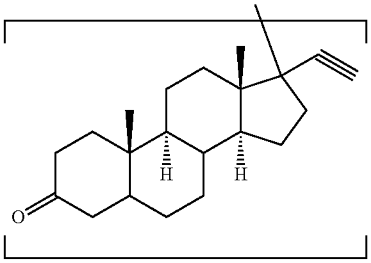

-continued
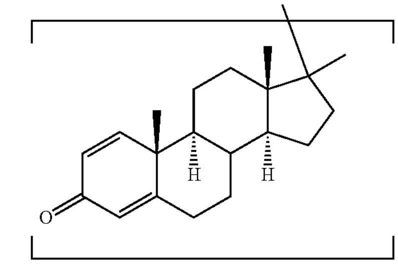
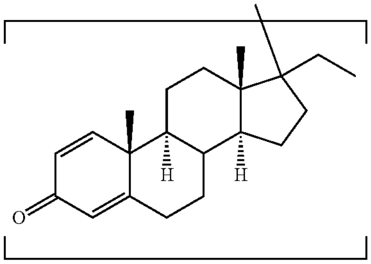
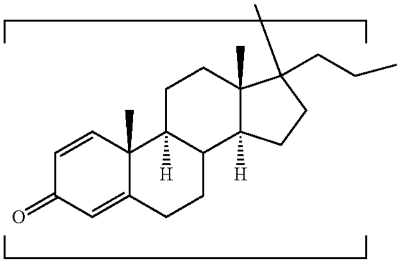
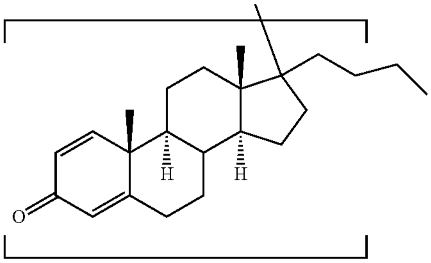
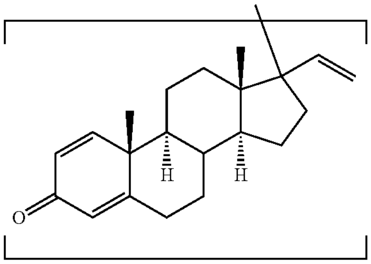
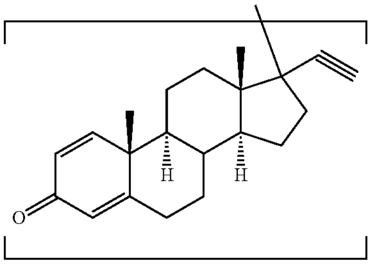
-continued
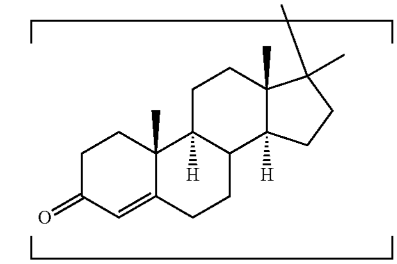
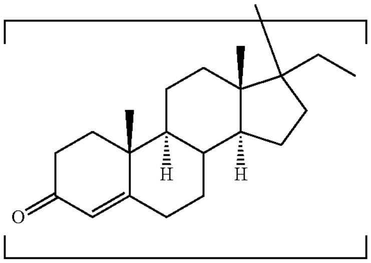
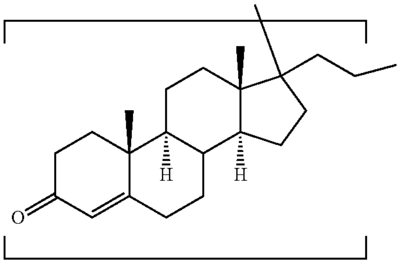
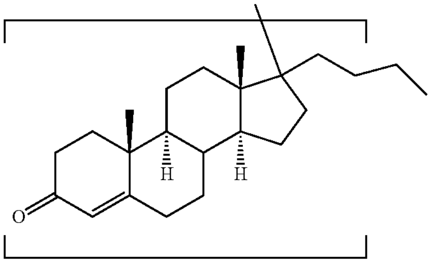
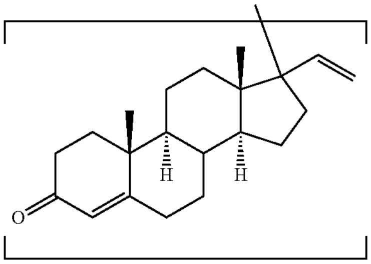
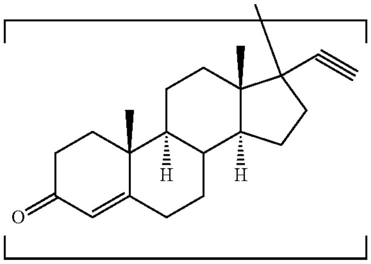

-continued
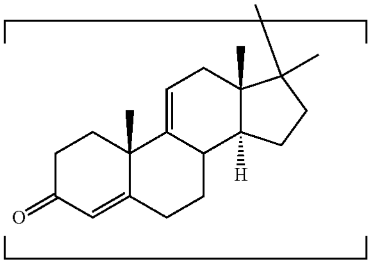
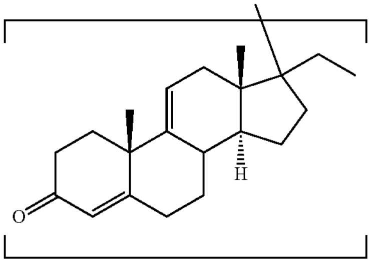
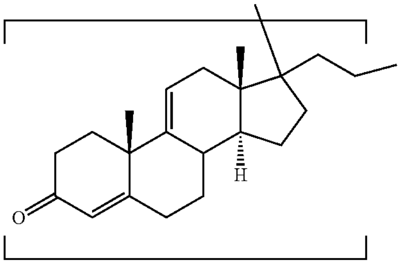
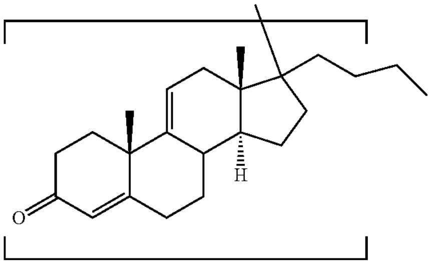
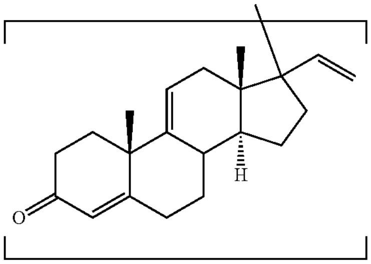
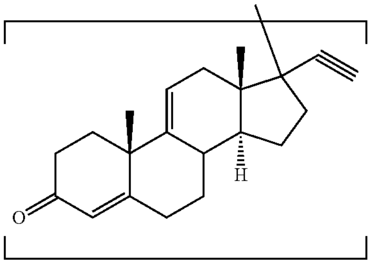
-continued
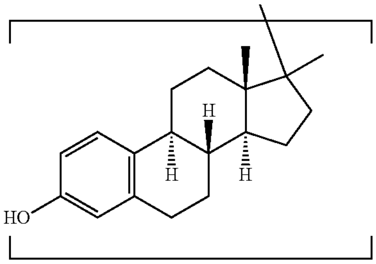
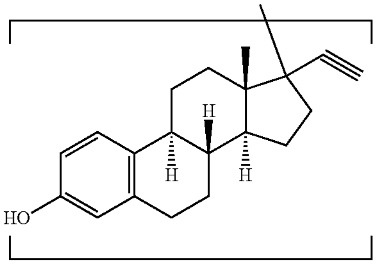
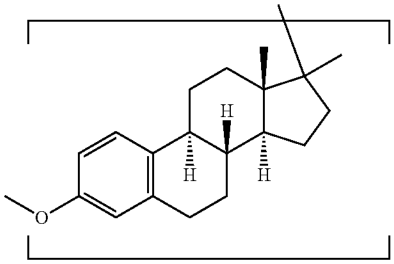
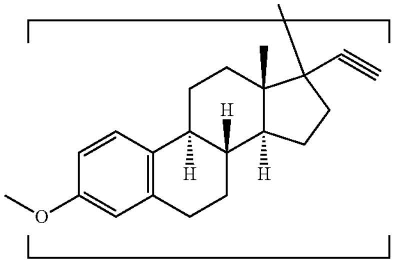
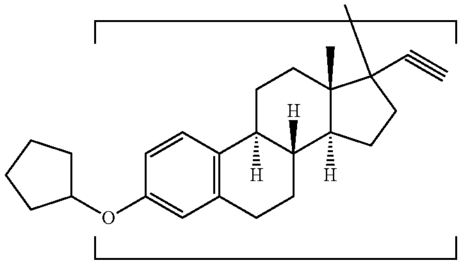
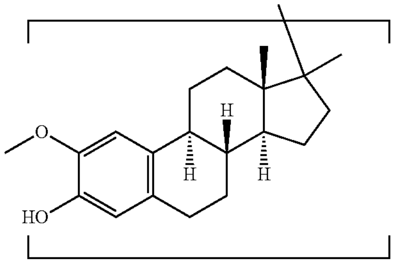

-continued

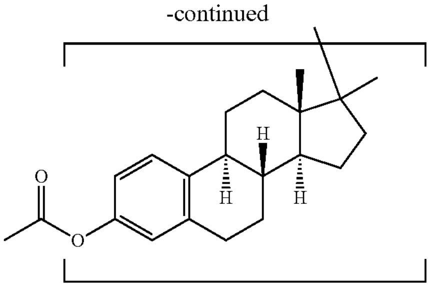

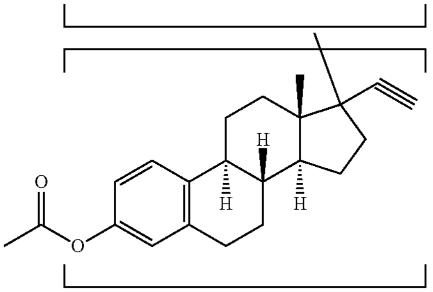

The androstane or estrane-substituted cholane used in the positive resist composition may be a blend of cholanes having different acid labile groups or substituent groups. Further the cholane may be blended with a conventional acid labile group-substituted polymer.

Via deprotection reaction catalyzed by the acid generated by the acid generator upon light exposure, the androstane or estrane-substituted cholane is decomposed into an androstane or estrane and a cholane. Since the androstane or estrane and the cholane have substantially equal molecular weights, the molecular weight is divided into half by the deprotection reaction, whereby the dissolution in developer is facilitated.

The acid labile group in the form of a tertiary ester group of methyladamantane or analogues, is deprotected with the aid of acid and heat during bake or the like, whereupon methyleneadamantane formed by deprotection is evaporated from the film during the bake (PEB). This leaves a free volume, whereby the film in the exposed region is shrunk. Acid diffusion is accelerated by creation of a free volume. This is the reason why a bulky acid labile group entailing a large free volume, if used, behaves such as to increase an acid diffusion distance. In contrast, the androstane or estrane ester group according to the invention forms a deprotected product having an extraordinarily greater molecular weight than conventional acid labile groups and having a very low vapor pressure due to oxygen functionality, suggesting that it does not evaporate off the film during PEB. Therefore, it leaves no free volume and can suppress acid diffusion despite molecular resist material. In addition, the deprotected product dissolves in alkaline developer due to the oxygen functionality.

Depending on a particular purpose, the resin in the form of an androstane or estrane-substituted cholane is combined with an acid generator and optionally an organic solvent, basic compound, surfactant, dissolution regulator, acetylene alcohol and the like, to formulate a positive resist composition. In the exposed region of the resist film, the androstane or estrane-substituted cholane undergoes catalytic reaction so that the dissolution rate in the developer is accelerated. In this sense, the positive resist composition has a very high sensitivity. The resist film has a high dissolution contrast and resolution, exposure latitude, and process adaptability, forms a pattern of good profile after exposure and with a reduced proximity bias due to controlled acid diffusion, and possesses high etch resistance. Because of these advantages, the composition is readily implemented in practice and best suited as a VLSI-forming resist material.

Particularly when an acid generator is blended, a chemically amplified positive resist composition capable of utilizing acid-catalyzed reaction is formulated, which composition is quite useful due to a higher sensitivity and better other properties. Further, addition of a basic compound is effective in suppressing the diffusion rate of acid in the resist film, achieving a further improvement in resolution. Addition of a surfactant may improve or control the coating characteristics of the resist composition.

The acid generator used herein may be any compound capable of generating an acid upon exposure to high-energy radiation. The preferred PAG may be selected from sulfonium salts, iodonium salts, sulfonyldiazomethane, N-sulfonyloxyimide, and oxime-O-sulfonate acid generators. These compounds may be used alone or in admixture. Suitable acid generators are described, for example, in JP-A 2008-111103, paragraphs [0122] to [0142] (U.S. Pat. No. 7,537,880).

Of these acid generators, sulfonium or iodonium salts of steroid structure anions have reduced acid diffusion and are compatible with the inventive resin because of coincidence of partial structure, so that they are uniformly distributed after film formation, contributing to a further reduction of LWR.

Suitable organic solvents include those described in JP-A 2008-111103, paragraphs [0144] to [0145], for example, ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

Examples of the basic compound used herein include primary, secondary, and tertiary amine compounds as described in JP-A 2008-111103, paragraphs [0146] to [0164], specifically amine compounds having a hydroxyl, ether, ester, lactone, cyano or sulfonic acid ester group. Exemplary surfactants are described in JP-A 2008-111103, paragraphs [0165] to Exemplary dissolution regulators are described in JP-A 2008-122932 (US 2008090172), paragraphs [0155] to [0178], and exemplary acetylene alcohols in paragraphs [0179] to [0182]. Also, a polymeric quencher as described in JP-A 2008-239918 may be added. The polymeric quencher segregates on the resist surface after coating, thereby improving the rectangularity of the resist after patterning. The polymeric quencher is also effective for preventing a film thickness loss of the pattern and rounding of the pattern top when added to a protective film for immersion lithography.

Of these basic compounds, amine compounds of steroid structure are effective for reducing acid diffusion and compatible with the inventive resin because of coincidence of partial structure, so that they are uniformly distributed after film formation, contributing to a further reduction of LWR.

When the resist composition is applied to ArF immersion lithography, an additive for improving water repellency is preferably added. Polymers having fluoroalcohol are preferably used as the additive for improving water repellency.

When expressed in parts by weight per 100 parts by weight of the base resin, i.e., androstane or estrane-substituted cholane, an appropriate amount of the acid generator used is 0.01 to 100 parts, preferably 0.1 to 80 parts, an appropriate amount of the organic solvent used is 50 to 10,000 parts, preferably 100 to 5,000 parts, an appropriate amount of the basic compound is 0 to 100 parts, preferably 0.001 to 50 parts, an appropriate amount of the surfactant is 0 to 10 parts, preferably 0.0001 to 5 parts, and an appropriate amount of the water repellency improver is 0 to 20 parts, preferably 0.001 to 10 parts.

Process

When the resist composition of the invention, typically a chemically amplified resist composition comprising the androstane or estrane-substituted cholane, an organic solvent, an acid generator, and a basic compound is used to form a variety of integrated circuits, any well-known lithography processes are applicable. The process generally involves coating, prebake, exposure, PEB, and development. If necessary, any additional steps may be added.

For instance, the positive resist composition is applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous alkaline solution for 3 seconds to 3 minutes, preferably 5 seconds to 2 minutes by conventional techniques such as dip, puddle and spray techniques. Suitable developers include 0.1 to 10 wt %, preferably 2 to 10 wt %, more preferably 2 to 8 wt % aqueous solutions of tetramethylammonium hydroxide (TMAH), tetraethylammonium hydroxide (TEAH), tetrapropylammonium hydroxide (TPAH), and tetrabutylammonium hydroxide (TBAH). The exposed region of resist film is dissolved in the developer whereas the unexposed region of resist film is insoluble. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

In another embodiment, a negative tone pattern may be formed via organic solvent development. Preferably, the developer is at least one organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, tert-butylbenzene, and mesitylene. The solvents may be used alone or in admixture.

Example

Synthesis Examples and Examples of the invention are given below by way of illustration and not by way of limitation. The abbreviation "pbw" is parts by weight. For all polymers, Mw and Mn are determined versus polystyrene standards by GPC.

Synthesis Example 1

A cholane resin 1 was synthesized according to the following reaction scheme, by esterifying reaction of dehydrocholic acid chloride with 17α-methylandrostan-17β-ol-3-one in a standard way.

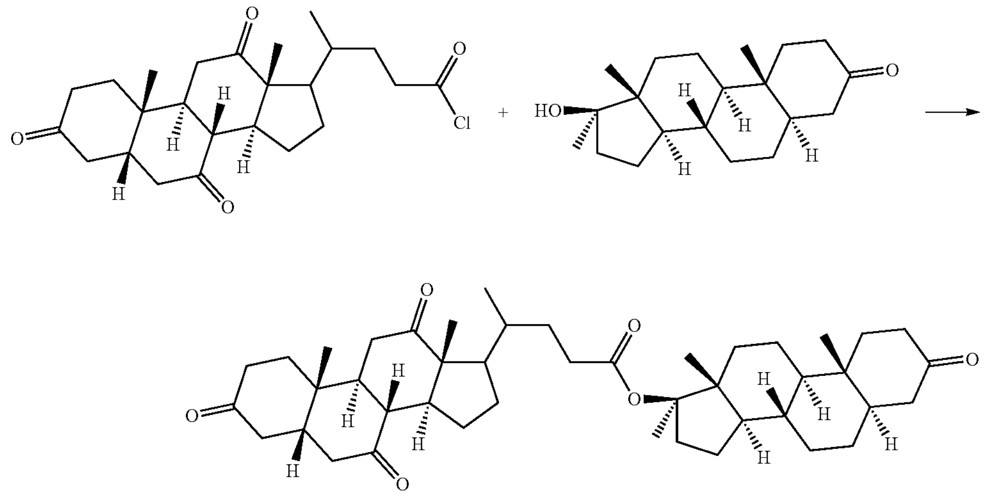

Cholane resin 1

Synthesis Examples 2 to 10

Cholane resins 2 to 10 were synthesized by the same reaction as in Synthesis Example 1. Their structural formula is shown below.

Cholane resin 2

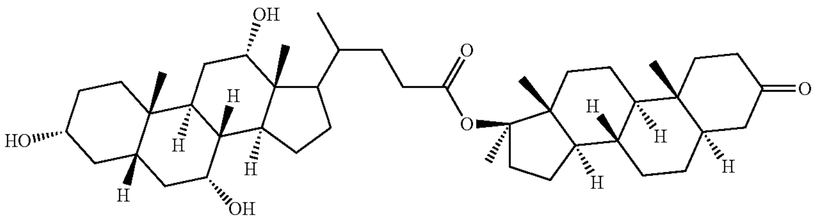

Cholane resin 3

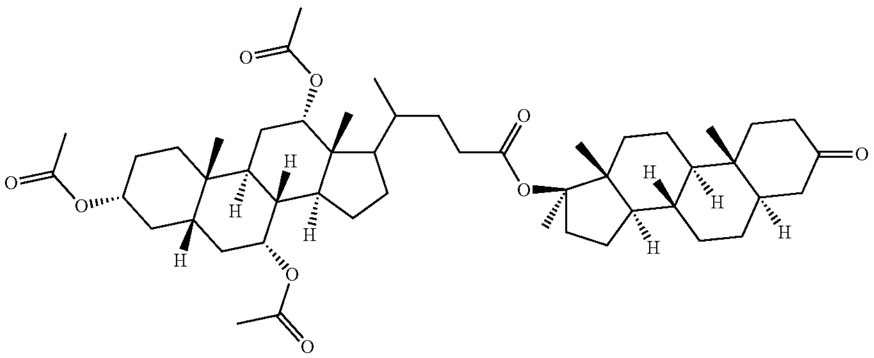

-continued
Cholane resin 4
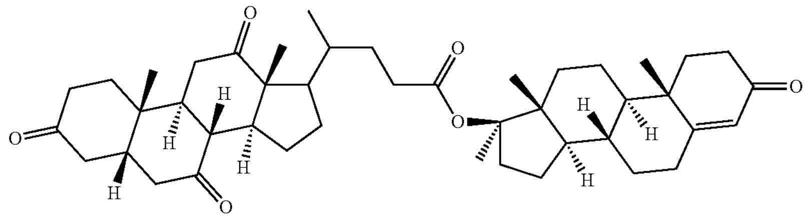
Cholane resin 5
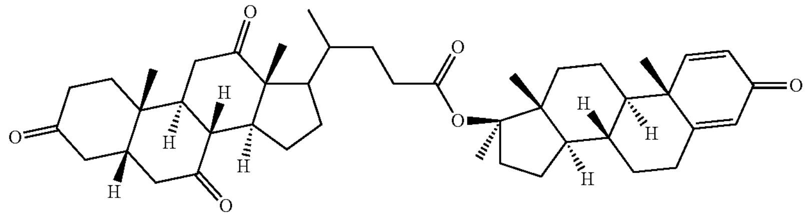
Cholane resin 6
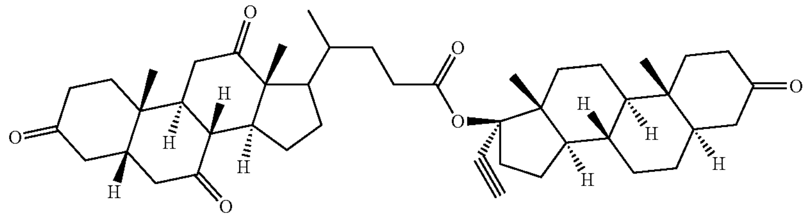
Cholane resin 7
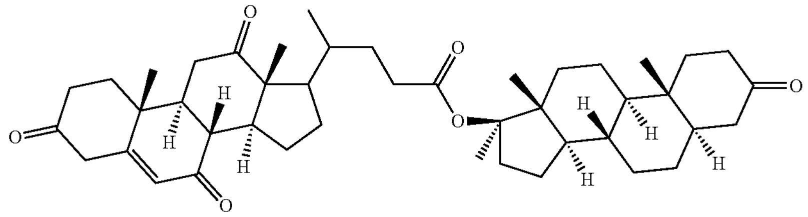
Cholane resin 8
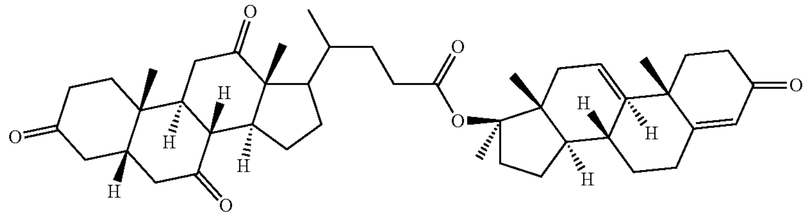
Cholane resin 9
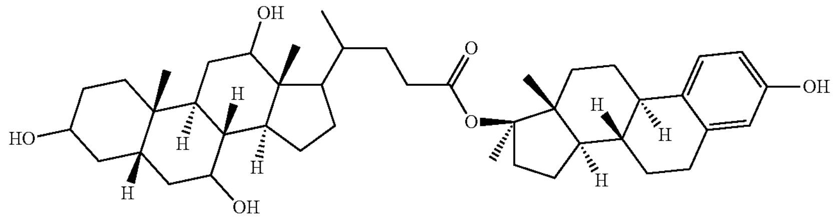
Cholane resin 10
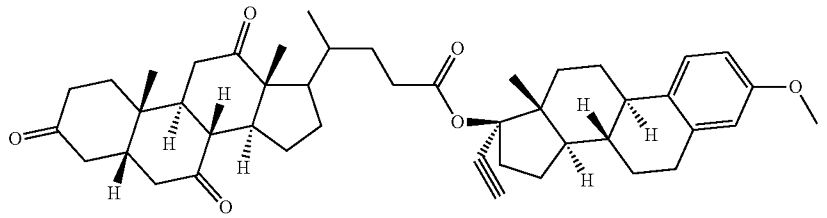

Examples and Comparative Examples

Positive resist compositions were prepared by dissolving components in Tables 1 and 2 in a solvent containing 100 ppm of surfactant FC-4430 (3M-Sumitomo Co., Ltd.) and filtering through a filter with a pore size of 0.2 μm. The components in Tables 1 and 2 are identified below.

Cholane Resins 1 to 10: As Above

Comparative cholane resin 1 of the structural formula shown below

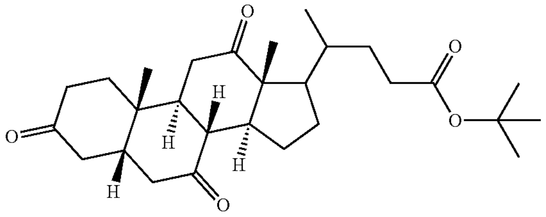

Comparative cholane resin 1

Resist Polymer 1:

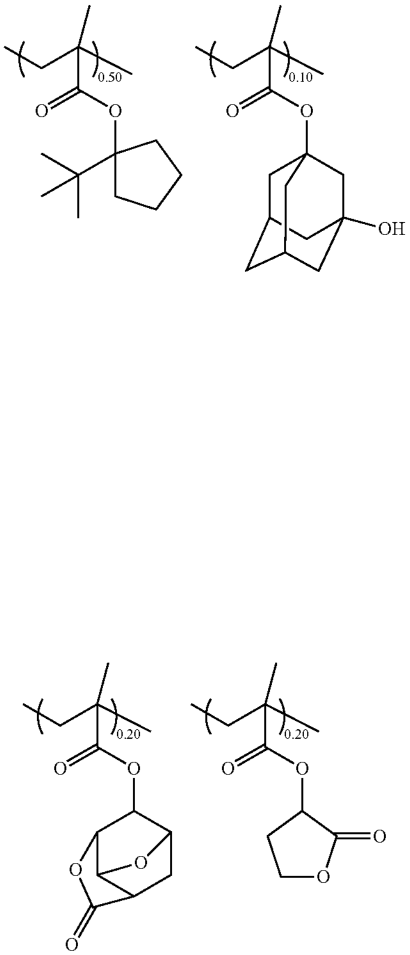

Resist Polymer 1
Mw = 8,700
Mw/Mn = 1.77

Organic solvent:

PGMEA (propylene glycol monomethyl ether acetate)

GBL (γ-butyrolactone)

Acid generator: PAG-1 to 4 of the structural formula shown below

PAG 1

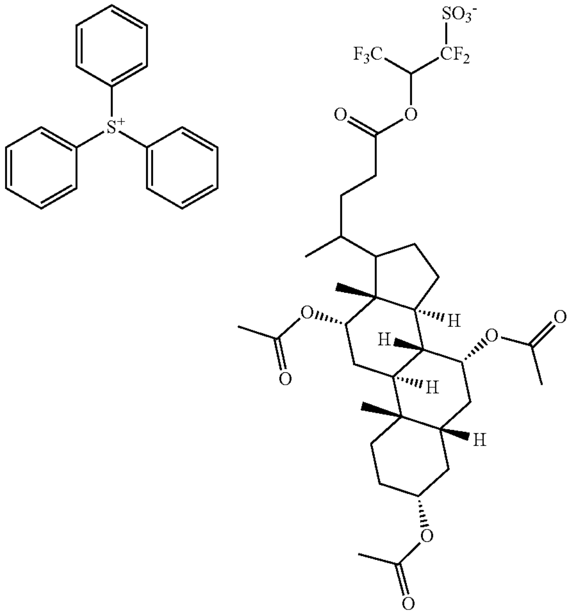

PAG 2

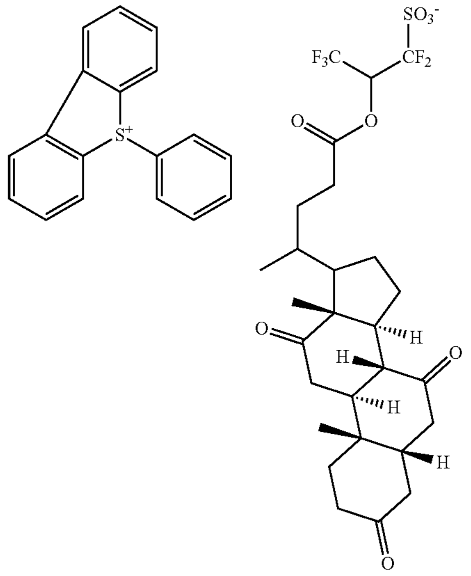

-continued

PAG 3

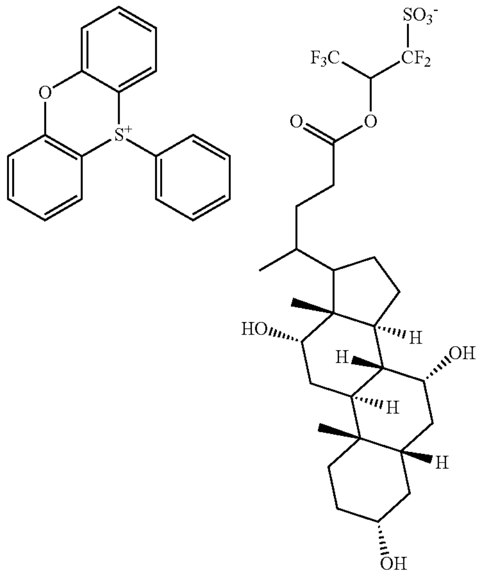

PAG 4

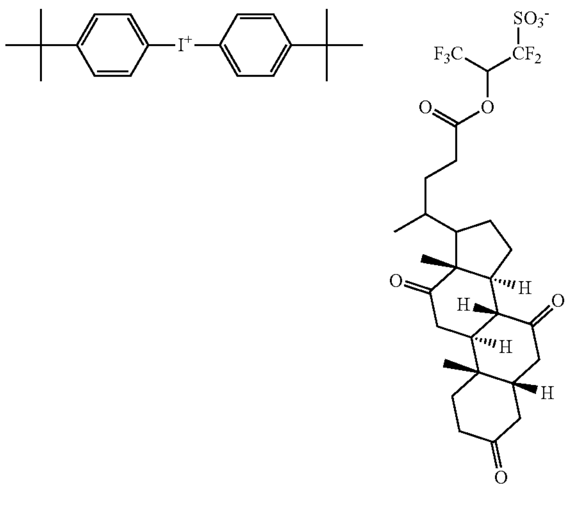

Basic compound: Amine 1 of the structural formula shown below

Amine 1

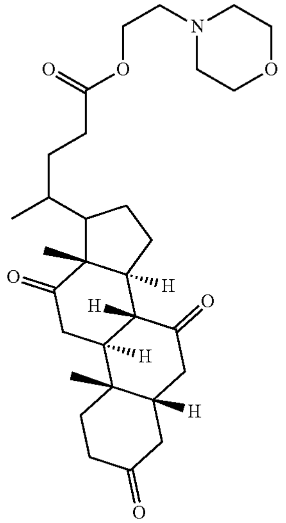

Water-repellent polymer 1 of the structural formula shown below

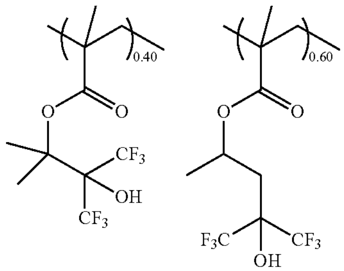

Water-repellent polymer 1
Mw = 8,000, Mw/Mn = 1.68

Examples 1-1 to 1-3 and Comparative Example 1-1

ArF Lithography Patterning Test

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 1 was spin coated, then baked on a hot plate at 100° C. for 60 seconds to form a resist film of 70 nm thick.

Using an ArF excimer laser immersion lithography scanner NSR-610C (Nikon Corp., NA 1.30, σ 0.98/0.78, dipole opening 20 deg., azimuthally polarized illumination), exposure was performed in a varying dose through a 6% halftone phase shift mask bearing a line-and-space pattern with a width of 40 nm and a pitch of 80 nm (on-wafer size). After the exposure, the wafer was baked (PEB) at the temperature shown in Table 1 for 60 seconds and puddle developed in an aqueous solution of 2.38 wt % tetramethylammonium hydroxide (TMAH) for 20 seconds. The wafer was rinsed with deionized water, forming a positive line-and-space pattern.

By means of CD-SEM, 40-nm lines were measured for roughness (LWR), with the results shown in Table 1.

TABLE 1

| | | | Polymer (pbw) | Additive (pbw) | Acid generator (pbw) | Basic compound (pbw) | Organic solvent (pbw) | PEB temp. (° C.) | LWR (nm) |
|---|---|---|---|---|---|---|---|---|---|
| Example | 1-1 | Resist 1-1 | Cholane resin 1 (100) | Water-repellent polymer 1 (5) | PAG 1 (10.0) | Amine 1 (4.0) | PGMEA (2,200) GBL (200) | 70 | 2.1 |
| | 1-2 | Resist 1-2 | Cholane resin 1 (50) Cholane resin 2 (50) | Water-repellent polymer 1 (5) | PAG 1 (10.0) | Amine 1 (4.0) | PGMEA (2,200) GBL (200) | 70 | 2.4 |
| | 1-3 | Resist 1-3 | Cholane resin 3 (100) | Water-repellent polymer 1 (5) | PAG 1 (10.0) | Amine 1 (4.0) | PGMEA (2,200) GBL (200) | 70 | 2.6 |
| Comparative Example | 1-1 | Comparative Resist 1-1 | Resist Polymer 1 (100) | Water-repellent polymer 1 (5) | PAG 1 (10.0) | Amine 1 (4.0) | PGMEA (2,200) GBL (200) | 90 | 3.8 |

Examples 2-1 to 2-11 and Comparative Examples 2-1 to 2-2

EB Writing Test

A silicon substrate having a diameter of 6 inches was vapor primed with hexamethyldisilazane (HMDS). Using a coater/developer system Clean Track Mark 5 (Tokyo Electron Ltd.), the resist composition in Table 2 was spin coated onto the substrate and pre-baked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the resist film was baked (PEB) on a hot plate at the temperature shown in Table 2 for 60 seconds and puddle developed in a 2.38 wt % TMAH aqueous solution for 20 seconds to form a positive line-and-space pattern.

The resist pattern was evaluated as follows. Sensitivity is the dose that provides 1:1 resolution of a 120-nm line-and-space pattern. The roughness (LWR) of the 120-nm L/S pattern was measured under SEM. The sensitivity (or resolution) and LWR on EB lithography are shown in Table 2 together with the formulation of resist composition.

TABLE 2

| | | | Polymer (pbw) | Acid generator (pbw) | Basic compound (pbw) | Organic solvent (pbw) | PEB temp. (° C.) | Sensitivity ($\mu C/cm^2$) | LWR (nm) |
|---|---|---|---|---|---|---|---|---|---|
| Example | 2-1 | Resist 2-1 | Cholane resin 1 (100) | PAG 2 (10) | Amine 1 (3.0) | PGMEA (2,000) | 70 | 38 | 5.0 |
| | 2-2 | Resist 2-2 | Cholane resin 2 (100) | PAG 2 (10) | Amine 1 (3.0) | PGMEA (2,000) | 70 | 38 | 5.3 |
| | 2-3 | Resist 2-3 | Cholane resin 3 (100) | PAG 2 (10) | Amine 1 (3.0) | PGMEA (2,000) | 70 | 44 | 5.0 |
| | 2-4 | Resist 2-4 | Cholane resin 4 (100) | PAG 2 (10) | Amine 1 (3.0) | PGMEA (2,000) | 70 | 45 | 5.1 |
| | 2-5 | Resist 2-5 | Cholane resin 5 (100) | PAG 3 (10) | Amine 1 (3.0) | PGMEA (2,000) | 70 | 41 | 5.6 |
| | 2-6 | Resist 2-6 | Cholane resin 6 (100) | PAG 4 (10) | Amine 1 (3.0) | PGMEA (2,000) | 70 | 48 | 4.3 |
| | 2-7 | Resist 2-7 | Cholane resin 7 (100) | PAG 2 (10) | Amine 1 (3.0) | PGMEA (2,000) | 70 | 39 | 4.6 |
| | 2-8 | Resist 2-8 | Cholane resin 8 (100) | PAG 2 (10) | Amine 1 (3.0) | PGMEA (2,000) | 70 | 39 | 5.0 |
| | 2-9 | Resist 2-9 | Cholane resin 9 (100) | PAG 2 (10) | Amine 1 (3.0) | PGMEA (2,000) | 70 | 43 | 4.6 |
| | 2-10 | Resist 2-10 | Cholane resin 10 (100) | PAG 2 (10) | Amine 1 (3.0) | PGMEA (2,000) | 70 | 30 | 5.8 |
| | 2-11 | Resist 2-11 | Resist Polymer 1 (50) Cholane resin 1 (50) | PAG 2 (10) | Amine 1 (3.0) | PGMEA (2,000) | 80 | 45 | 5.1 |
| Comparative Example | 2-1 | Comparative Resist 2-1 | Comparative Cholane resin 1 (100) | PAG 2 (10) | Amine 1 (3.0) | PGMEA (2,000) | 80 | 45 | 8.0 |
| | 2-2 | Comparative Resist 2-2 | Resist Polymer 1 (100) | PAG 2 (10) | Amine 1 (3.0) | PGMEA (2,000) | 90 | 48 | 6.5 |

It is evident from the data of Tables 1 and 2 that the resist compositions of the invention show minimal edge roughness.

Japanese Patent Application No. 2014-237496 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a resin and an acid generator, the resin having the general formula (1)-1 and/or (1)-2:

(1)-1

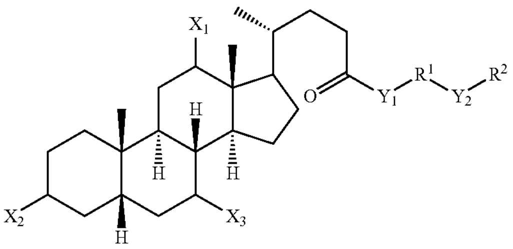

(1)-2

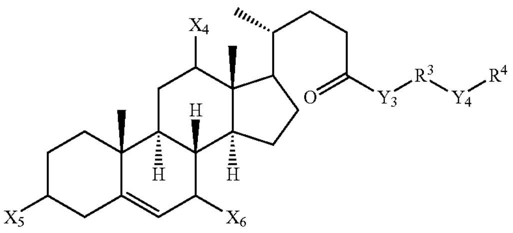

wherein $R^1$ and $R^3$ each are a single bond or a straight, branched or cyclic $C_1$-$C_{20}$ alkylene group which may have an ether or ester moiety, $Y_1$ and $Y_3$ each are oxygen or —NH—, $Y_2$ and $Y_4$ are single bonds when $R^1$ and $R^3$ are single bonds, and otherwise —C(═O)—O—, $X_1$ to $X_6$ are each independently hydrogen, hydroxy, alkoxy, acyloxy or carbonyl, $R^2$ and $R^4$ each are an acid labile group selected from the following formulae (1)-3 to (1)-7:

(1)-3

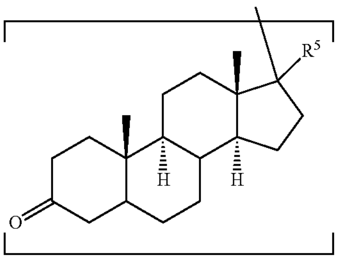

-continued (1)-4

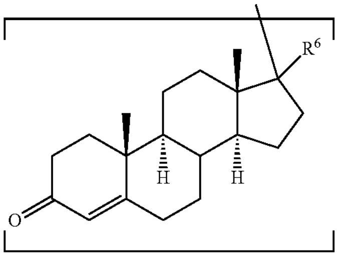

(1)-5

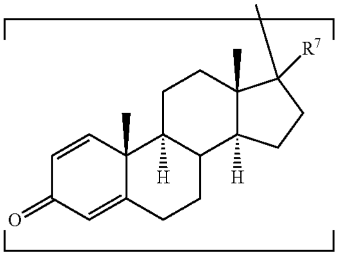

(1)-6

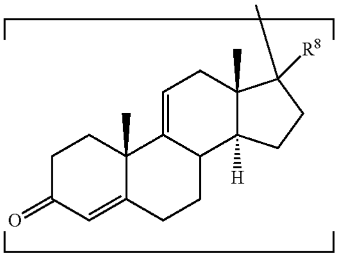

(1)-7

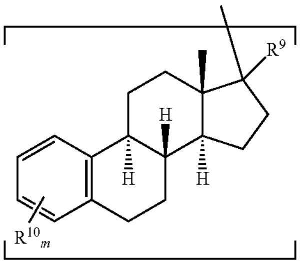

wherein $R^5$ to $R^9$ are each independently a straight, branched or cyclic $C_1$-$C_4$ alkyl, $C_2$-$C_4$ alkenyl, or $C_2$-$C_4$ alkynyl group, $R^{10}$ is hydroxy, alkoxy or acyloxy, m is 1 or 2, the line segment protruding out of the bracket denotes a valence bond.

2. The positive resist composition of claim 1, further comprising an organic solvent.

3. The positive resist composition of claim 1, further comprising a basic compound and/or surfactant.

4. A pattern forming process comprising the steps of coating a substrate with the positive resist composition of claim 1, baking the composition to form a resist film, exposing the resist film to high-energy radiation, and developing the exposed resist film in a developer.

* * * * *